(12) United States Patent
Gandhi et al.

(10) Patent No.: US 10,971,474 B1
(45) Date of Patent: Apr. 6, 2021

(54) PACKAGE INTEGRATION FOR HIGH BANDWIDTH MEMORY

(71) Applicant: Xilinx, Inc., San Jose, CA (US)

(72) Inventors: Jaspreet Singh Gandhi, San Jose, CA (US); Henley Liu, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/289,975

(22) Filed: Mar. 1, 2019

(51) Int. Cl.
| | |
|---|---|
| *H01L 23/48* | (2006.01) |
| *H01L 23/52* | (2006.01) |
| *H01L 29/40* | (2006.01) |
| *H01L 25/065* | (2006.01) |
| *H01L 25/18* | (2006.01) |
| *H01L 23/00* | (2006.01) |
| *H01L 25/00* | (2006.01) |

(52) U.S. Cl.
CPC .......... *H01L 25/0652* (2013.01); *H01L 24/16* (2013.01); *H01L 24/81* (2013.01); *H01L 25/18* (2013.01); *H01L 25/50* (2013.01); *H01L 2224/10125* (2013.01); *H01L 2224/16145* (2013.01); *H01L 2224/16227* (2013.01); *H01L 2224/81815* (2013.01); *H01L 2225/06513* (2013.01); *H01L 2225/06517* (2013.01); *H01L 2225/06589* (2013.01); *H01L 2924/3512* (2013.01)

(58) Field of Classification Search
CPC . H01L 2224/32145; H01L 2224/48145; H01L 25/0657; H01L 2224/16145; H01L 23/3128; H01L 2225/06541

USPC ........ 257/686, 777, 778, 723, 724; 438/107, 438/108, 109, 110
See application file for complete search history.

(56) References Cited

U.S. PATENT DOCUMENTS

| | | | |
|---|---|---|---|
| 6,184,062 B1* | 2/2001 | Brofman | H01L 24/11 438/106 |
| 6,559,527 B2* | 5/2003 | Brofman | H01L 24/11 257/678 |
| 7,224,071 B2* | 5/2007 | Odegard | H01L 21/563 257/778 |
| 8,288,201 B2* | 10/2012 | Pagaila | H01L 21/56 257/687 |
| 9,147,661 B1 | 9/2015 | Kwon et al. | |
| 9,418,966 B1 | 8/2016 | Kwon et al. | |
| 2002/0079577 A1* | 6/2002 | Ho | H01L 23/49816 257/737 |
| 2003/0193093 A1* | 10/2003 | Brofman | H01L 23/49827 257/779 |
| 2009/0152738 A1* | 6/2009 | Sathe | H05K 3/303 257/777 |
| 2011/0248398 A1 | 10/2011 | Parvarandeh et al. | |

OTHER PUBLICATIONS

Lau, John, MCM, SiP, SoC, and Heterogeneous Integration Defined and Explained, 3DInCites, Aug. 7, 2017.
Iyer, Subu, "CHIPS", UCLA Engineering, Henry Samueli School of Engineering and Applied Science, Powerpoint.

* cited by examiner

Primary Examiner — S. V. Clark
(74) Attorney, Agent, or Firm — Patterson + Sheridan, LLP

(57) ABSTRACT

A chip package and method of fabricating the same are described herein. The chip package generally includes a stand-off which spaces a die from a substrate to control the collapse of a solder joint coupling the die to the substrate.

20 Claims, 6 Drawing Sheets

US 10,971,474 B1

PACKAGE INTEGRATION FOR HIGH BANDWIDTH MEMORY

TECHNICAL FIELD

Embodiments of the present disclosure generally relate to chip packages and electronic devices having the same. In particular, to chip packages having at least one stand-off spacing a die from a substrate to control the collapse of the solder connection coupling to the die to the substrate, and methods for fabricating the same.

BACKGROUND ART

Electronic devices, such as tablets, computers, server, in-door telecom, out-door telecom, industrial computers, high performance computing data centers, copiers, digital cameras, smart phones, control systems and automated teller machines, among others, often employ electronic components which leverage chip packages for increased functionality and higher component density. Conventional chip packages include one or more stacked components such as integrated circuit (IC) dies, through-silicon-via (TSV) interposer, and a package substrate, with the chip package itself stacked on a printed circuit board (PCB). The IC dies may include memory, logic, MEMS, RF or other IC device.

In flip-chip mounting and connection methods, thermo-mechanical reliability is becoming an increasing concern of the electronics industry. Notably, the reliability of the integrated circuit interconnects, e.g., solder joints, is one of the most critical issues for successful application of such mounting and connection methods. However, solder joints formed using known methods are prone to necking, which may lead to cracking of the solder joint. The propensity for necking is even more problematic in packages having a first die with a solder joint that extends further from the first die than a solder joint of a second die interfacing with the same substrate. Such high mismatching displaces solder along the pillars forming the solder joint, which undesirably promotes wicking of solder away from the main solder connection, ultimately resulting in a solder joint that is prone to failure.

Therefore, there is a need for improved integrated circuit interconnects and methods of forming improved solder joints for an integrated circuit.

SUMMARY

A chip package and method of fabricating the same are described herein. The chip package generally includes a stand-off which spaces a die from a substrate to control the collapse of a solder joint coupling the die to the substrate.

In one example, a chip package is provided that includes a substrate having a first die and a second die mounted thereto. The substrate has a plurality of landing pads disposed on a top surface of the substrate. The plurality of landing pads are arranged in at least a first plurality of landing pads and a second plurality of landing pads. The first die has a first plurality of contact pads disposed on a bottom surface of the first die. The first plurality of contact pads are electrically and mechanically coupled with the first plurality of landing pads. The second die has a second plurality of contact pads disposed on a bottom surface of the second die. The second plurality of contact pads are electrically and mechanically coupled with the second plurality of landing pads. A first stand-off is disposed between the substrate and second die, and spaces the top surface of the substrate from the bottom surface of the second die.

In another example, a chip package is provided that includes a substrate, a logic die and a high-bandwidth memory stack. The substrate has a plurality of homogenous landing pads disposed on a top surface of the substrate. The plurality of homogenous landing pads are arranged in at least a first plurality of landing pads and a second plurality of landing pads. The logic die has a first plurality of contact pads disposed on a bottom surface of the logic die. The first plurality of contact pads are electrically and mechanically coupled with the first plurality of landing pads. The high-bandwidth memory stack is mounted to the top surface of the first substrate adjacent the logic die. The high-bandwidth memory stack has a second plurality of contact pads that are electrically and mechanically coupled with the second plurality of landing pads. The second plurality of contact pads has a construction different than that of the first plurality of contact pads. A plurality of stand-offs is disposed between the substrate and the high-bandwidth memory stack, the plurality of stand-offs spacing the top surface of the substrate from the high-bandwidth memory stack.

In yet another example, a method for forming a chip package is provided that includes mounting a first plurality of contact pads extending from a logic die on a first plurality of landing pads disposed on a top surface of a substrate; mounting a second plurality of contact pads extending from a high-bandwidth memory stack on a second plurality of landing pads disposed on the top surface of the substrate, the first plurality of contact pads and the second plurality of contact pads having a heterogeneous construction, the first plurality of landing pads and the second plurality of landing pads having a homogeneous construction; contacting a plurality of stand-offs disposed on the top surface of the substrate with the high-bandwidth memory stack; and reflowing the first plurality of contact pads and the first plurality of landing pads, and the second plurality of contact pads and the second plurality of landing pads to establish electrical and mechanical solder connections through the pads.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Examples described herein generally provide chip packages and methods of fabricating chip packages. The chip package described herein generally includes at least one or more stand-offs which spaces a die from a substrate. The one or more stand-offs control a distance in which a solder joint coupling the die to the substrate collapses, which consequently controls an amount of solder displaced from the solder joint, which substantially prevents wicking and starvation of solder from the solder connection. As a result, the stand-offs provide more robust and reliable solder joints, and accordingly, a more robust, reliable and better performing chip package. The use of one or more stand-offs to control the spacing between a die and a substrate is particularly advantageous in chip packages having two or more dies that have dissimilar (i.e., heterogeneous) solder joint heights coupling the dies to the substrate. The above improvements are particularly useful in chip packages that integrate a stack of HBM (high bandwidth memory) dies having one solder joint height with an adjacent logic die having a different solder joint height within a single package.

Figure 1:
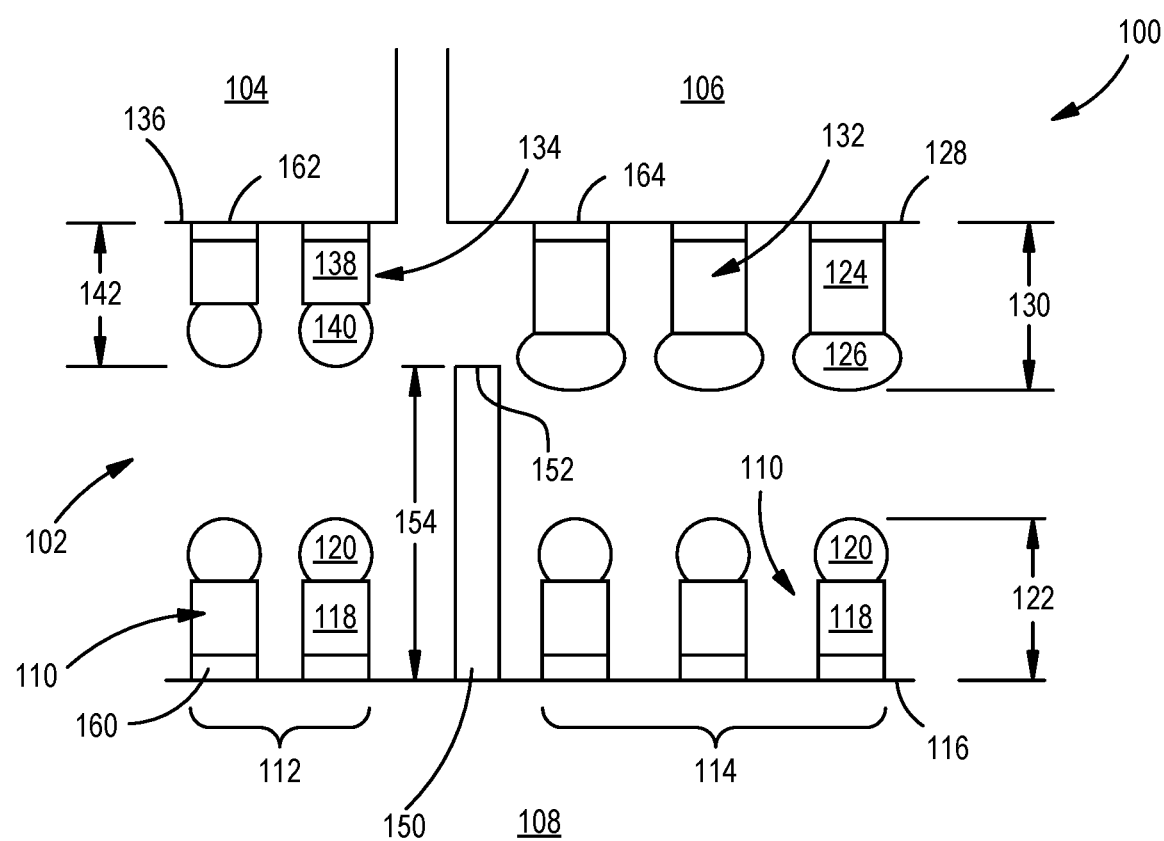
FIG. 1 is an exploded partial cross sectional schematic view of an integrated circuit chip package having at least two dies and a substrate.

Turning now to FIG. 1, an exploded partial cross sectional schematic view of an integrated circuit chip package 100 having at least two dies 104, 106 and a substrate 108 is shown. The dies 104, 106 are mounted to a top surface 116 of the substrate 108 utilizing solder joints 102. The solder joints 102 are shown exploded in FIG. 1 with half of the joints extending from the dies 104, 106 and have of the joints extending from the substrate 108. The number of solder joints 102 illustrated in FIG. 1 and elsewhere herein is greatly reduced to avoid drawing clutter and provide clarity to the illustrations.

The dies 104, 106 may be the same type of die or different types of dies. The first die 104 may be a single die mounted to the substrate 108, or the first die 104 may optionally be an I/O die that providing an interface for one or more dies stacked on the first die 104 with the substrate 108. Similarly, the second die 106 may be a single die mounted to the substrate 108, or the second die 106 may optionally be an I/O die that providing an interface for one or more dies stacked on the second die 106 with the substrate 108. Examples of chip packages having the first die 104 configured as a single die mounted to the substrate 108 and the second die 108 configured as an I/O die mounted to the substrate 108 are later illustrated in FIGS. 4-5

Continuing to refer to FIG. 1, one or both of the dies 104, 106 may be configured as programmable logic devices, such as field programmable gate arrays (FPGA), memory devices, optical devices, processors or other IC logic structures. Optical devices include photo-detectors, lasers, optical sources, and the like. In the example depicted in FIG. 1, the first die 104 is configured as a logic die, while the second die 106 is configured as a memory die or as an O/I die upon which a plurality of memory dies are stacked thereon.

The substrate 108 upon with dies 104, 106 are mounted may be configured as an interposer substrate or a package substrate. The substrate 108 generally includes circuitry electrically connecting circuitry of the dies 104, 106 with circuitry of an underlying substrate not shown in FIG. 1. In one example wherein the substrate 108 is configured as an interposer substrate, the circuitry of the interposer substrate electrically connects the circuitry of the dies 104, 106 with the circuitry of the underlying package substrate. In another one example wherein the substrate 108 is configured as a package substrate, the circuitry of the package substrate electrically connects the circuitry of the dies 104, 106 with circuitry of an underlying printed circuit board (PCB) when the chip package 100 is mounted to the PCB to form an electronic device.

The top surface 116 of the substrate 108 includes a plurality of landing pads 110. The plurality of landing pads 110 are arranged in at least a first group of landing pads 112 and a second group of landing pads 114. The first group of landing pads 112 is configured to electrically and mechanically couple with a first group of contact pads 134 extending from a bottom surface 136 of the first die 104. The second group of landing pads 114 is configured to electrically and mechanically couple with a second group of contact pads 132 extending from a bottom surface 128 of the second die 106.

The first group of landing pads 112 and the second group of landing pads 114 generally have a homogeneous construction. The homogeneous construction of the groups of landing pads 112, 114 allows for more cost effective and efficient fabrication of the substrate 108. For example, each group of landing pads 112, 114 include a pillar 118 and a solder bump 120, the pillar 118 and the solder bump 120 having the same construction across all of the groups of landing pads 112, 114. Each pillar 118 is formed on a contact 160 formed on the substrate 108. The contacts 160 form the terminus of the portion of the circuitry of the substrate 108 accessible from the top surface 116 of the substrate 108. The pillar 118 is generally fabricated from copper, but may include one or more layers of other conductive material, such as nickel. The first and second groups of landing pads 112, 114 extend from the top surface 116 of the substrate 108 to a height 122 prior to connecting with the dies 104, 106.

As discussed above, the first group of contact pads 134 extending from the bottom surface 136 of the first die 104. Each contact pad 134 comprising of the first group of contact pads 134 includes a pillar 138 and a solder bump 140. Each pillar 138 is formed on a contact 162 formed on the first die 104. The contacts 162 form the terminus of the portion of the circuitry of the first die 104 accessible from the bottom surface 136 of the first die 104. The pillar 138 is generally fabricated from copper, but may include one or more layers of other conductive material, such as nickel. The contact pads 134 extend from the bottom surface 136 of the first die 104 to a height 142 prior to connecting with the substrate 108.

The construction of the first group of contact pads 134 extending from the bottom surface 136 of the first die 104 and the first group of landing pads 112 extending from the top surface 116 of the substrate may also have a homogeneous construction. As such the height 122 is substantially the same as the height 142, for example, the heights 122, 142 are within 10 percent prior to connecting with the first die 104 and the substrate 108.

The second group of contact pads 132 extending from the bottom surface 128 of the second die 106 generally have a homogeneous construction. Each contact pad 132 comprising of the second group of contact pads 132 includes a pillar 124 and a solder bump 126. Each pillar 124 is formed on a contact 164 formed on the second die 106. The contacts 162 form the terminus of the portion of the circuitry of the second die 106 accessible from the bottom surface 128 of the second die 106. The pillar 124 is generally fabricated from copper, but may include one or more layers of other conductive material, such as nickel. The contact pads 132 extend from the bottom surface 128 of the second die 106 to a height 130 prior to connecting with the substrate 108.

The construction of the second group of contact pads 132 extending from the bottom surface 128 of the second die 106 is different than (i.e., heterogeneous to) the construction of the first group of contact pads 134 extending from the bottom surface 136 of the first die 104. In the example depicted in FIG. 1, the height 130 is substantially greater the height 142. For example, the height 130 may be at least 14-15 µm greater than the height 142 prior to connecting with the second die 106 and the substrate 108. The difference in heights 130, 142, and consequently the cause of the heterogeneous construction, may be due to a difference in heights of the pillars, a difference in height (diameter or axis through the center) of the solder bumps 120, 126. Alternatively, the heterogeneous construction may be due to a difference the solder volume or other geometry of the solder bumps solder bumps 120, 126.

One or more stand-offs 150 are disposed between the second die 106 and the substrate 108 to accurately control the geometry of the solder joint 102 upon attachment of the second die 106 to the substrate 108. Although one stand-off 150 is shown in FIG. 1, any suitable number of stand-offs 150 may be utilized. In one or more examples, the stand-off 150 is not attached to the circuitry of the second die 106 or the circuitry of the substrate 108. The stand-off 150 may be fabricated from a conductive or non-conductive material. The stand-off 150 may be coupled to one or both of the second die 106 and the substrate 108.

In the example depicted in FIG. 1, the stand-off 150 is attached to the top surface 116 of the substrate 108 and extends in a direction perpendicular to a plane of the top surface 116 towards the second die 106, exterminating at a top surface 152. A height 154 of the stand-off 150 is defined between the top surface 152 of the stand-off 150 is and the top surface 116 of the substrate 108. The height 154 is generally less than the sum of the heights 122, 130. The difference between the height 154 and the sum of the heights 122, 130 is selected to control the spacing between the bottom surface 128 of the second die 106 and the facing top surface 116 of the substrate 108. In one example, the height 154 is about 85 to 95 percent of the sum of the heights 122, 130. The controlled spacing is selected to control the displacement of the solder within the bumps 120, 126 upon reflow when jointing the second die 106 to the substrate 108 in a manner that substantially inhibits solder wetting and wicking up the pillars 118, 124. As a result, sufficient solder advantageously remains bridging the pillars 118, 124 for a robust and reliable mechanical and electrical connection between the second die 106 and the substrate 108.

In the example depicted in FIG. 1, the stand-off 150 is fabricated from a metal or metal containing material. The stand-off 150 is plated or otherwise deposited on the top surface 116 of the substrate 108. In one example, the stand-off 150 is plated copper. Alternatively, the stand-off 150 may be disposed on the bottom surface 128 of the second die 106.

The use of stand-offs 150 is particularly advantageous when a distance across the solder joints 102 formed between one die and the substrate 108 is different that a distance across the solder joints 102 formed between another die and the substrate 108. In such configurations, stand-offs 150 utilized between the die and substrate 108 having the greater distance across the solder joint 102 will help manage the displacement of solder volumes to form a robust joint, thus providing larger process windows and more flexibility to utilize a wider variety of dies to which the fabricator may not have control of the solder volumes utilized on the bumps. Stated differently, the stand-offs 150 yield more robust joints when coupling dies 104, 106 having contact pads 132, 134 of differing heights 130, 142 to a common surface or side of the substrate 108 by preventing uncontrolled collapse of the solder joints. The stand-offs 150 also compensate for configurations having large solder volumes and/or heavy die stacks to prevent the solder from squeezed out of the solder joint to a location that may short circuit an adjacent solder joint or cause failure within the solder joint.

Figure 2:
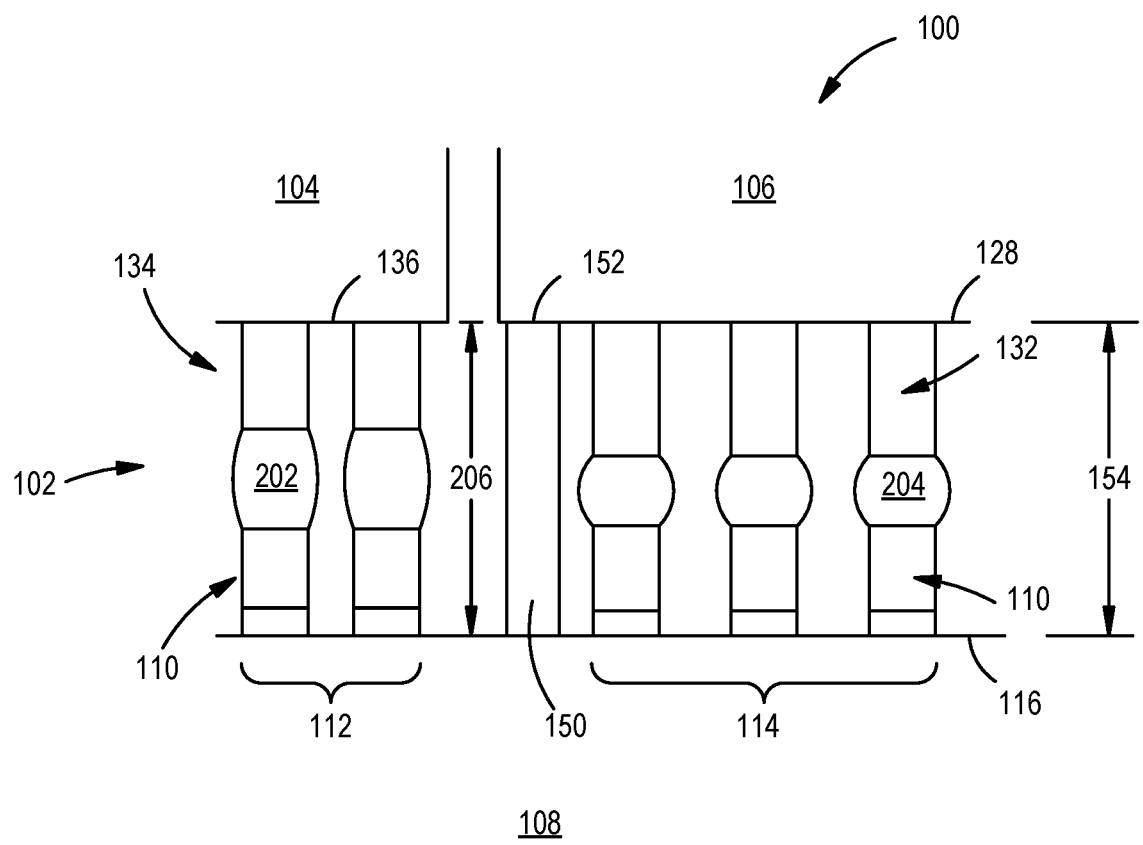
FIG. 2 is a partial cross sectional schematic view of the integrated circuit chip package of FIG. 1 showing the dies mounted to a first side of the substrate utilizing solder joints.

FIG. 2 is a partial cross sectional schematic view of the integrated circuit chip package 100 of FIG. 1 showing the dies 104, 106 mounted to the top surface 116 of the substrate 108 utilizing solder joints 102. As illustrated in FIG. 2, the heterogeneous landing pads 110, comprised of groups 112, 114, are connected to the contact pads 132, 134, of the dies 104, 106 to form solder connections 202, 204. The solder connections 202 comprise the solder bumps 120, 140 after attach and reflow of the solder. Similarly, the solder connections 204 comprise the solder bumps 120, 126 after attach and reflow of the solder. After solder connections 202, 204 comprising the solder joints 102 have been formed, a distance between the first die 104 and the substrate 108 across the solder connection 202 is shown as a height 206, while a distance between the second die 106 and the substrate 108 across the solder connection 204 is equal to the height 154 due to the stand-off 150 contacting both the top surface 116 of the substrate 208 and the bottom surface 128 of the second die 106. As described above, the stand-off 150 yield more robust joints when coupling dies 104, 106 having contact pads 132, 134 of differing heights 130, 142 (as shown in FIG. 1) to a common side or surface of the substrate 108 by preventing uncontrolled collapse of the solder joints resulting in the heights 154 and 206 being substantially equal, for example, within about 1-2 µm.

As discussed above, although one stand-off 150 is shown in FIGS. 1 and 2, any suitable number of stand-offs 150 may be utilized. The stand-offs 150 may also be located in various locations relative to the pillars 118 of the landing pads 110, as further illustrated in FIG. 3 described below.

Figure 3:
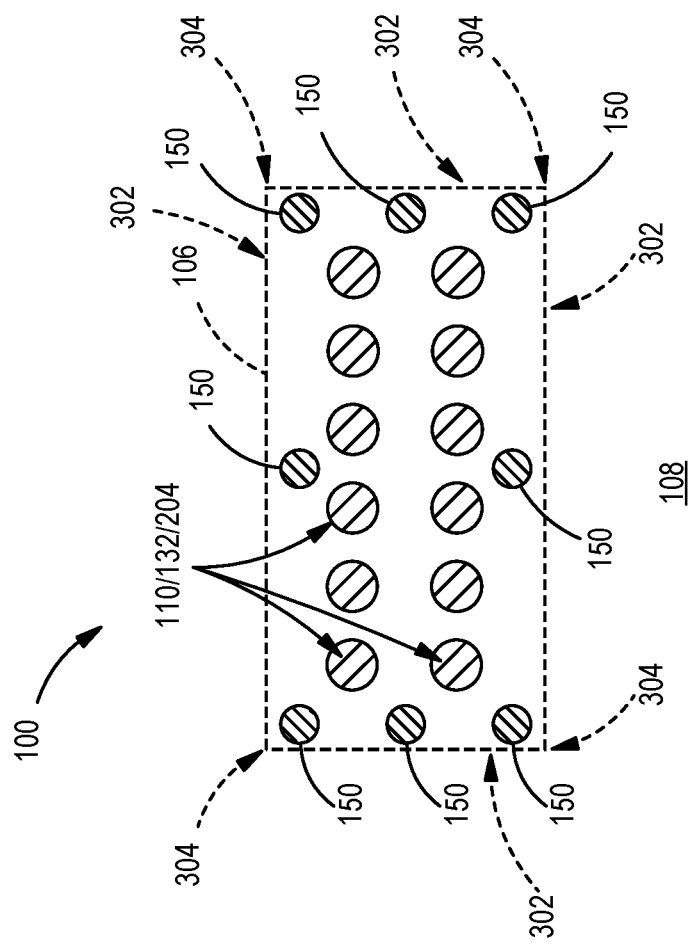
FIG. 3 is a partial horizontal cross sectional schematic view of the chip package of FIG. 2 taken through the solder joints.
Figure 3:
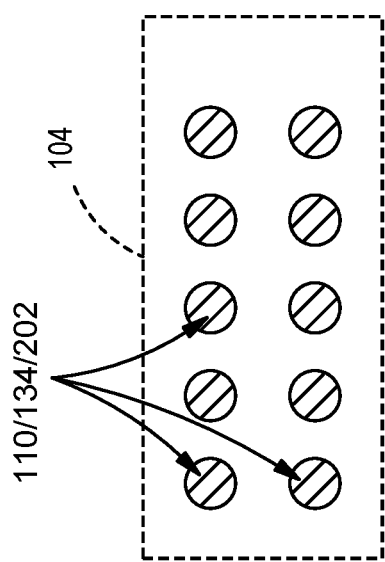

FIG. 3 is a partial horizontal cross sectional schematic view of the chip package 100 of FIG. 2 taken through the solder joints 102 illustrating one example of an arrangement of stand-offs 150 relative to the location of the landing pads 110. The arrangement of stand-offs 150 relative to the location of the landing pads 110 may also be different than what is illustrated in FIG. 3. The landing pads 110 coupling the first die 104 (shown in phantom) are aligned with the contact pads 134 to make the solder connections 202. As shown, all of the solder connections 202 are located within the areal extent of the first die 104. Similarly, the landing pads 110 coupling the second die 106 (also shown in phantom) are aligned with the contact pads 132 to make the solder connections 204. As shown, all of the solder connections 204 are also located within the areal extent of the second die 106.

To contact the second die 106, all stand-offs 150 extending from the substrate 108 are also located within the areal extent of the second die 106. In one example, the stand-offs 150 are located outward of the solder connections 204, for example, closer to an edge 302 of the second die 106 (as shown by the phantom line). In one or more examples, at least one stand-off 150 may be located proximate the corners 304 of second die 106. For example, at least one stand-off 150 may be located proximate each of the corners 304 of second die 106. In one or more examples, at least one stand-off 150 may be located along an edge 302 of second die 106 defined between two corners 304 of the second die 106. For example, at least one stand-off 150 may be located along each edge 302 of second die 106 of second die 106 defined between each adjacent corners 304 of the second die 106. In other examples, the stand-offs 150 may be located in the corners 304 and along the edges 302 of the second die 106. In any of the examples above, one or more stand-offs 150 may be located between two or more of the solder connections 204 coupling the substrate 108 to the second die 106. In yet another example, one or more stand-offs 150 may be located between two or more of the solder connections 204 coupling the substrate 108 to the second die 106.

Figure 4:
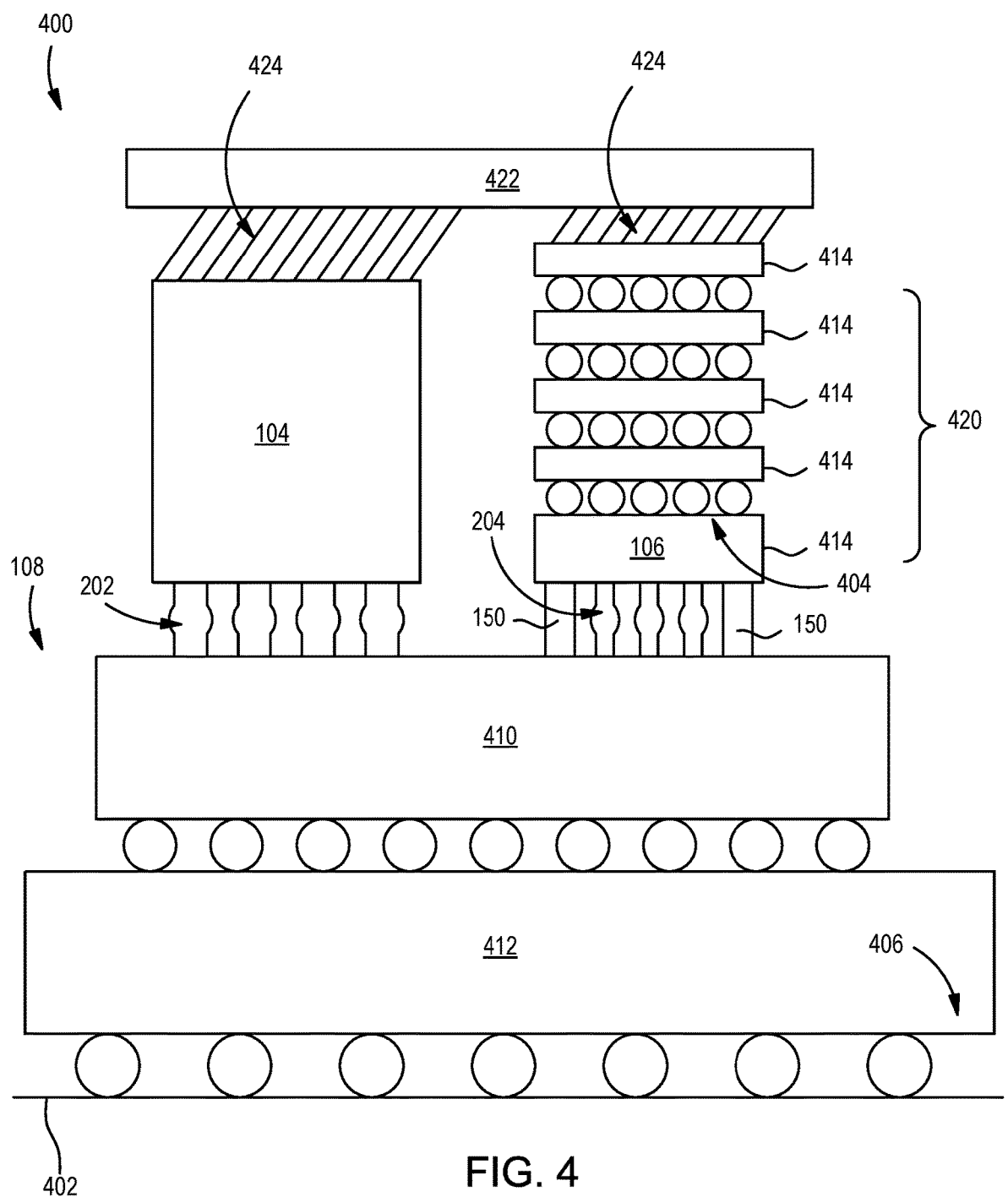
FIG. 4 is a cross sectional schematic view of an integrated circuit electronic device that includes an integrated circuit chip package mounted on a printed circuit board, the chip package has at least two adjacent dies mounted to a first side of a substrate, wherein a least one of the dies is spaced from the first side of the substrate by at least one or more stand-offs.

FIG. 4 is a cross sectional schematic view of an integrated circuit electronic device 400 that includes an integrated circuit chip package 100 mounted on a printed circuit board (PCB) 402. The chip package 100 has at least two adjacent dies 104, 106 mounted to a top surface 116 of a substrate 108, wherein a least one of the dies 104, 106 is spaced from the top surface 116 of the substrate 108 by at least one or more stand-offs 150 in the manner described above. The dies 104, 106 may be partially encapsulated in a molding compound, and an underfill maybe be utilized to fill the interstitial space defined between the first and second dies 104, 106 and the substrate 108.

An optional cover 422 may be disposed on the first and second dies 104, 106. In some examples, the cover 422 may be coupled to the substrate 108, for example, utilizing a stiffener, not shown. The cover 422 may be fabricated from a dielectric or conductive material. In the example depicted in FIG. 4, the cover 422 is fabricated from a conductive material and functions as a heat sink for the first and second dies 104, 106 of the chip package 100. The cover 422 may optionally include fins for enhancing heat transfer or have a separate heat sink disposed thereon.

When a cover 422 is utilized, thermal interface material (TIM) 424 may be disposed between the cover 422 and the first and second dies 104, 106 of the chip package 100 to enhance heat transfer therebetween. In one example, the TIM 424 may be a thermal polymer adhesive, a thermally conductive film, a thermally conductive liquid, thermal gel or thermal epoxy.

In the example depicted in FIG. 4, the substrate 108 is configured as an interposer substrate 410 mounted to a package substrate 412. The interposer substrate 410 generally includes circuitry electrically connecting circuitry of the dies 104, 106 with circuitry of the package substrate 412. A bottom surface 406 of the package substrate 412 is mounted to the PCB 402. The circuitry of the package substrate 412 electrically connects the circuitry of the dies 104, 106 with circuitry of the underlying PCB 402 to form the electronic device 400.

Figure 5:
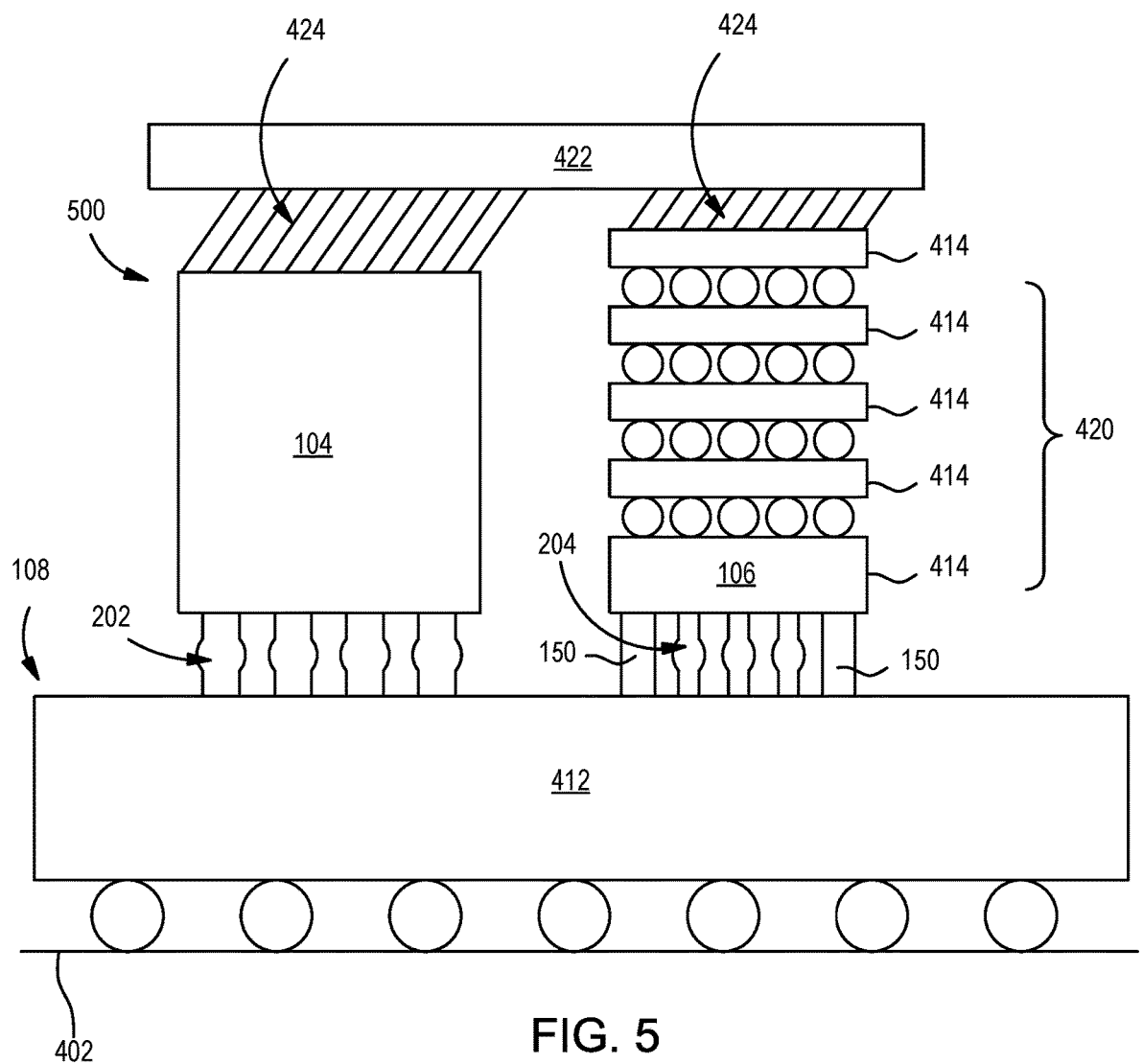
FIG. 5 is a cross sectional schematic view of another integrated circuit electronic device that includes an integrated circuit chip package mounted on a printed circuit board, the chip package has at least two adjacent dies mounted to a first side of a substrate, wherein a least one of the dies is spaced from the first side of the substrate by at least one or more stand-offs.

In the example depicted in FIG. 5, the substrate 108 is configured as a package substrate 412. In the example of FIG. 5, there is no interposer substrate disposed between the dies 104, 106 and the package substrate 412. The circuitry of the package substrate 412 generally connects the circuitry of the dies 104, 106 with circuitry of the underlying PCB 402 to form an electronic device 500.

Returning to FIG. 4, in one example the first die 104 is configured as a logic die, while the second die 106 is configured as an O/I die for a plurality of memory dies 414 stacked on the I/O die. Together, the second die 106 with stacked memory dies 414 form a memory stack 420. Although 4 memory dies 414 are illustrated stacked on a top surface 404 the second die 106 in the example depicted in FIG. 4, other numbers of memory dies 414, such as 8, 12 or even more, may be stacked on the second die 106. The memory dies 414 may be configured as DRAM or other suitable memory device. In this arrangement, the chip package 100 may be configured as a high bandwidth memory (HBM) device, with the memory stack 420 being a HBM stack. The performance and reliability of the HBM chip package 100 is enhanced through the use of the stand-offs 150 as described above.

Although FIG. 4 is described above as an HBM chip package 100, the chip package 100 of FIG. 4 is also representative of any die pair 104, 106 that are coupled to a common side or surface of a substrate 108, where the substrate 108 has a homogeneous construction (for example the same height and solder volume) of landing pads 110 and the dies 104, 106 have a heterogeneous construction of contact pads 132, 134 between the dies 104, 106. It is contemplated that one or both of the dies 104, 106 may be stacked with another die, and that one or both of the dies 104, 106 may not be stacked with another die. Other examples of packaging technologies represented by FIG. 4 include, without limitatino, multichip modules (MCM), system-in-package (SiP), system-on-chip (SoC), and heterogeneous integrations, among others.

Figure 6:
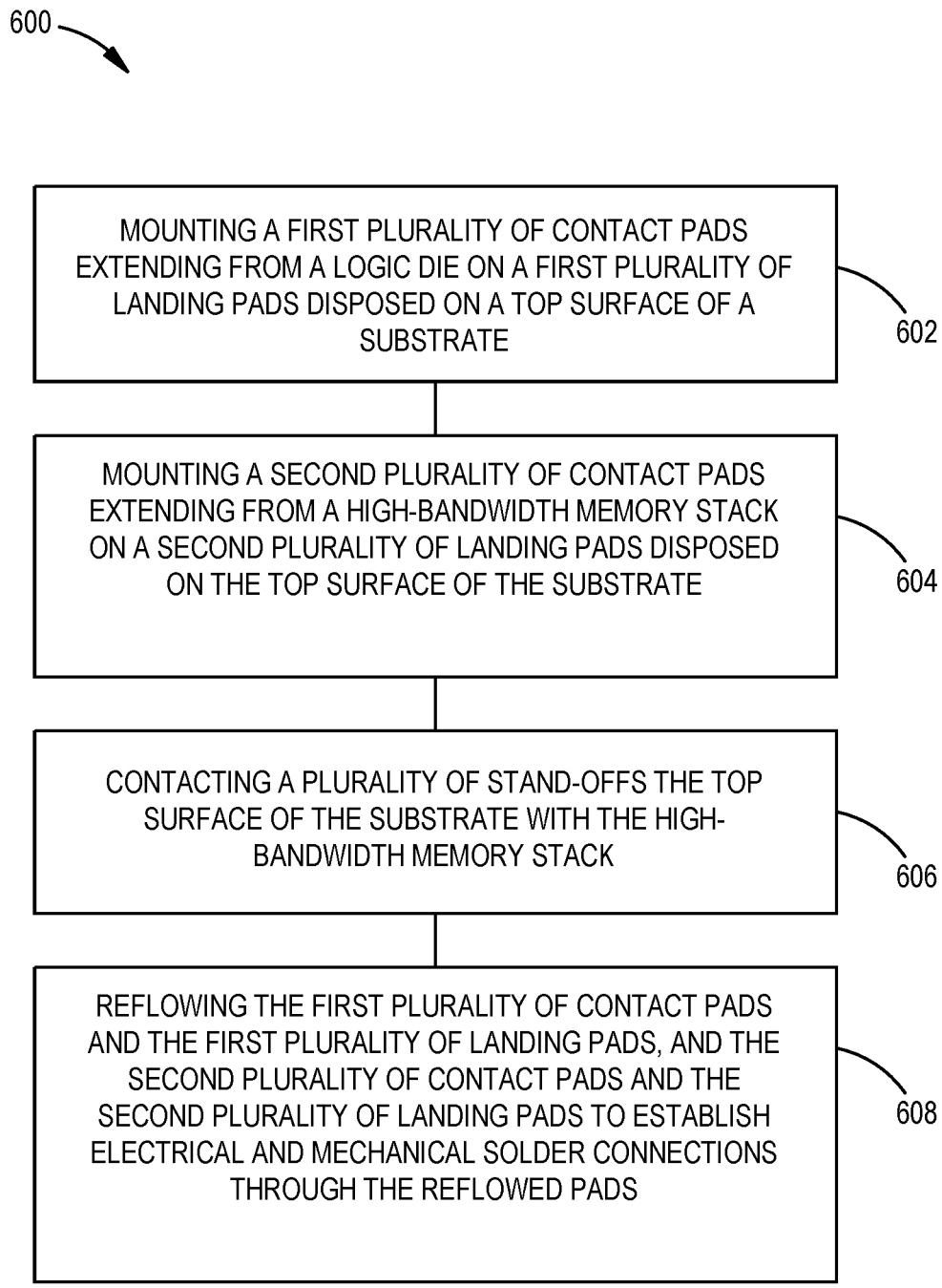
FIG. 6 is a flow diagram of a method of fabricating a chip package.

FIG. 6 is a flow diagram of a method 600 of fabricating a chip package. The method 600 begins at operation 602 by mounting a first plurality of contact pads extending from a logic die on a first plurality of landing pads disposed on a top surface of a substrate. At operation 604, a second plurality of contact pads extending from a high-bandwidth memory stack are mounted on a second plurality of landing pads disposed on the top surface of the substrate. The first plurality of contact pads and the second plurality of contact pads having a heterogeneous construction, while the first plurality of landing pads and the second plurality of landing pads having a homogeneous construction. Operations 602 and 604 may be performed in reverse order or at the same time.

At operation 606, a plurality of stand-offs disposed on the top surface of the substrate are contacted with the high-bandwidth memory stack to control the spacing, and thus the solder displacement in the solder joints, between the high-bandwidth memory stack and the substrate. Operation 606 generally occurs contemporaneously with operation 604.

At operation 608, the first plurality of contact pads and the first plurality of landing pads, and the second plurality of contact pads and the second plurality of landing pads, are reflowed to establish electrical and mechanical solder connections through the pads. During reflow, solder comprising solder joints coupling the substrate to the high-bandwidth memory stack is substantially prevented from displacing to a location that degregates the integrity of the solder joint due to the presence of the stand-off controlling the amount that the solder joint can collapse upon reflow.

The method 600 may further include one or more optional operations. For example, in an optional operation, an interstitial space defined between the second plurality of landing pads may be filled with an underfill compound, for example, from between at least two of the plurality of stand-offs. In another example, the method 600 may further include mounting a bottom surface of the substrate facing away from the high-bandwidth memory stack to a package substrate.

Terms "top" and "bottom" have utilized herein for clarity of description when referring to the appended Figures. The "top" and "bottom" may also refer to "front" and "back"; "sides"; "first" and "second"; or other geometric pairing denoting opposite sides or surfaces of an object.

Thus, a chip package having at least one or more stand-offs which space a die from a substrate has been described, along with techniques for manufacturing such chip packages. The one or more stand-offs control a distance in which a solder joint coupling the die to the substrate collapses, which consequently controls an amount of solder displaced from the solder joint. The controlled amount of solder displacement substantially prevents wicking and starvation of solder from the solder connection. As a result, the stand-offs provide an exceptionally robust and reliable solder joint, and accordingly, a more robust, reliable, and better performing chip package. As an added benefit, the stand-offs are particularly advantageous by allowing a wide variety of dies having dissimilar solder joint heights to be utilized within the same chip package because the dissimilar heights are compensated thought the use of the stand-offs. As a result, package designers and fabricators have greater flexibility of product design without the need or cost of custom designs, still obtaining excellent reliability, performance and throughput with minimal expense.

While the foregoing is directed to embodiments of the present disclosure, other and further embodiments may be devised without departing from the basic scope thereof, and the scope thereof is determined by the claims that follow.

What is claimed is:

1. A chip package comprising:
   a substrate having circuitry terminating at a plurality of landing pads disposed on a top surface of the substrate, the plurality of landing pads arranged in at least a first plurality of landing pads and a second plurality of landing pads;
   a first die having a first plurality of contact pads extending a first distance from a bottom surface of the first die, the first plurality of contact pads electrically and mechanically coupled with the circuitry of the substrate through the first plurality of landing pads;
   a second die having a second plurality of contact pads extending a second distance from a bottom surface of the second die, the second plurality of contact pads electrically and mechanically coupled with the circuitry of the substrate through the second plurality of landing pads, the first distance being less than the second distance; and
   a first stand-off controlling a spacing from the top surface of the substrate to the bottom surface of the second die.

2. The chip package of claim 1, wherein the first stand-off is fabricated from a conductive material.

3. The chip package of claim 1, wherein the first stand-off is copper.

4. The chip package of claim 1, wherein the first stand-off is plated on the top surface of the substrate.

5. The chip package of claim 1 further comprising:
   a second stand-off spacing the top surface of the substrate from the bottom surface of the second die.

6. The chip package of claim 5, wherein at least some of the second plurality of contact pads are disposed between the first stand-off and the second stand-off.

7. The chip package of claim 5 further comprising:
   a third stand-off spacing the top surface of the substrate from the bottom surface of the second die; and
   a fourth stand-off spacing the top surface of the substrate from the bottom surface of the second die, the first, second, third and fourth stand-offs each are disposed proximate a different corner of the second die.

8. The chip package of claim 5 further comprising:
   a third stand-off spacing the top surface of the substrate from the bottom surface of the second die; and
   a fourth stand-off spacing the top surface of the substrate from the bottom surface of the second die, the first, second, third and fourth stand-offs each are disposed proximate a different side of the second die.

9. The chip package of claim 1, wherein the first stand-off is fabricated from a dielectric material.

10. The chip package of claim 1, wherein the first die is a logic die.

11. The chip package of claim 10 further comprising:
    a plurality of memory dies stacked on a top surface of the second die, wherein the second die is an I/O die.

12. The chip package of claim 1, wherein the first plurality of contact pads and the second plurality of contact pads have a heterogeneous construction.

13. The chip package of claim 12, wherein the first plurality of landing pads and the second plurality of landing pads have a homogeneous construction.

14. A chip package comprising:
    a substrate having circuitry terminating at a plurality of homogenous landing pads disposed on a top surface of the substrate, the plurality of homogenous landing pads arranged in at least a first plurality of landing pads and a second plurality of landing pads;
    a first die having a first plurality of contact pads extending a first distance from a bottom surface of the first die, the first plurality of contact pads electrically and mechanically coupled with the circuitry of the substrate through the first plurality of landing pads;
    a second die mounted to the top surface of the substrate adjacent the first die, the second die having a second plurality of contact pads electrically and mechanically coupled with the circuitry of the substrate through the second plurality of landing pads, wherein the second plurality of contact pads have a construction different than that of the first plurality of contact pads extending a second distance from the second die, the second distance being greater than the first distance; and
    a plurality of stand-offs spacing the top surface of the substrate from the second die.

15. The chip package of claim 14, wherein the second die is part of a high-bandwidth memory stack and the second die is a logic die.

16. The chip package of claim 15, wherein the plurality of stand-offs space the top surface of the substrate from the high-bandwidth memory stack a distance that is substantially the same as a distance spacing the top surface of the substrate from the logic die.

17. The chip package of claim 16 further comprising:
    a dielectric material disposed between the high-bandwidth memory stack and the substrate, the dielectric material encapsulating the plurality of stand-offs, the second plurality of landing pads and the second plurality of contact pads.

18. A method for forming a chip package, the method comprising:
- mounting a first plurality of contact pads extending a first distance from a first die on a first plurality of landing pads disposed on a top surface of a substrate;
- mounting a second plurality of contact pads extending a second distance from a second die on a second plurality of landing pads disposed on the top surface of the substrate, the second distance being greater than the first distance, the first plurality of contact pads and the second plurality of contact pads having a heterogeneous construction, the first plurality of landing pads and the second plurality of landing pads having a homogeneous construction;
- contacting a plurality of stand-offs disposed on the top surface of the substrate with the second die; and
- reflowing the first plurality of contact pads and the first plurality of landing pads, and reflowing the second plurality of contact pads and the second plurality of landing pads to establish electrical and mechanical solder connections through the reflowed first plurality of contact and landing pads, and the reflowed second plurality of contact and landing pads, the solder connections electrically connecting circuitry of the first and second dies with circuitry of the substrate.

19. The method of claim 18 wherein mounting the second plurality of contact pads extending from the second die on the second plurality of landing pads further comprises mounting a high-bandwidth memory stack that includes the second die on the substrate.

20. The method of claim 18 further comprising:
- mounting a bottom surface of the substrate facing away from the second die to a package substrate.

* * * * *